(12) United States Patent
Ghotgalkar et al.

(10) Patent No.: US 12,174,658 B2
(45) Date of Patent: Dec. 24, 2024

(54) METHOD AND APPARATUS FOR EARLY DETECTION OF SIGNAL EXCURSION OUT OF FREQUENCY RANGE

(71) Applicant: Texas Instruments Incorporated, Dallas, TX (US)

(72) Inventors: Shailesh Ghotgalkar, Bangalore (IN); Rajeev Suvarna, Bangalore (IN); Prasanth Viswanathan Pillai, Bangalore (IN); Saravanan G, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 116 days.

(21) Appl. No.: 17/892,860

(22) Filed: Aug. 22, 2022

(65) Prior Publication Data

US 2023/0213958 A1 Jul. 6, 2023

(30) Foreign Application Priority Data

Jan. 5, 2022 (IN) .............................. 202241000495

(51) Int. Cl.
*G06F 1/08* (2006.01)
*G06F 1/12* (2006.01)
*G06F 11/16* (2006.01)
*H03K 5/135* (2006.01)
*H03K 5/26* (2006.01)

(52) U.S. Cl.
CPC .................. *G06F 1/08* (2013.01); *G06F 1/12* (2013.01); *H03K 5/135* (2013.01); *H03K 5/26* (2013.01); *G06F 11/1604* (2013.01)

(58) Field of Classification Search
CPC .......... G06F 1/12; G06F 1/08; G06F 11/1604; H03K 5/135; H03K 5/26
USPC ......................... 713/500, 502, 503, 400, 600
See application file for complete search history.

(56) References Cited

U.S. PATENT DOCUMENTS

| | | | |
|---|---|---|---|
| 2008/0165913 A1* | 7/2008 | Roquelaure ............ | H03K 21/40 377/29 |
| 2014/0191785 A1* | 7/2014 | Kim ........................ | H03L 1/027 327/113 |
| 2015/0035754 A1* | 2/2015 | Lim ........................ | H03L 7/00 345/166 |
| 2020/0285267 A1* | 9/2020 | Abdelmoneum ......... | G06F 1/14 |
| 2022/0223082 A1* | 7/2022 | Kim .......................... | G09G 3/20 |

* cited by examiner

*Primary Examiner* — Ji H Bae
(74) *Attorney, Agent, or Firm* — Brian D. Graham; Frank D. Cimino

(57) ABSTRACT

An example device comprising: first clock divider circuitry to be coupled to a first clock; first counter circuitry configured to be coupled to the first clock divider circuitry, the first counter circuitry configured to increment based on the first clock and a second clock; second clock divider circuitry to be coupled to a third clock; second counter circuitry configured to be coupled to the second clock divider circuitry, the second counter circuitry configured to increment based on the third clock and the second clock; and comparison circuitry coupled to the first and second counter circuitry.

20 Claims, 6 Drawing Sheets

METHOD AND APPARATUS FOR EARLY DETECTION OF SIGNAL EXCURSION OUT OF FREQUENCY RANGE

CROSS-REFERENCE TO RELATED APPLICATION

This patent application claims the benefit of and priority to Indian Provisional Patent Application Serial No. 202241000495 filed Jan. 5, 2022, which is hereby incorporated herein by reference in its entirety.

TECHNICAL FIELD

This description relates generally to signal excursion detection, and more particularly to methods and apparatus for early detection of signal excursion out of frequency range.

BACKGROUND

Clock sources include circuitry configured to generate a clock signal of a desired clock frequency. In some systems, such as in a microcontroller unit (MCU) or in a microprocessor unit (MPU), an accurate clock signal is needed to ensure functionality and to implement safety features. Clock frequency variations need to remain within a narrow frequency range to ensure functionality of a system. Such variations in the clock frequency from a desired clock frequency may be referred to as frequency excursion. Some applications include frequency excursion circuitry to detect variations in clock frequency greater than a designed threshold. For example, an MCU may include frequency excursion circuitry to ensure a clock frequency desired clock remains within a designed range, such as between plus or minus five percent of the desired frequency.

SUMMARY

For methods and apparatus for early detection of signal excursion out of frequency range, An example device comprising: first clock divider circuitry to be coupled to a first clock; first counter circuitry configured to be coupled to the first clock divider circuitry, the first counter circuitry configured to increment based on the first clock and a second clock; second clock divider circuitry to be coupled to a third clock; second counter circuitry configured to be coupled to the second clock divider circuitry, the second counter circuitry configured to increment based on the third clock and the second clock; and comparison circuitry coupled to the first and second counter circuitry.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
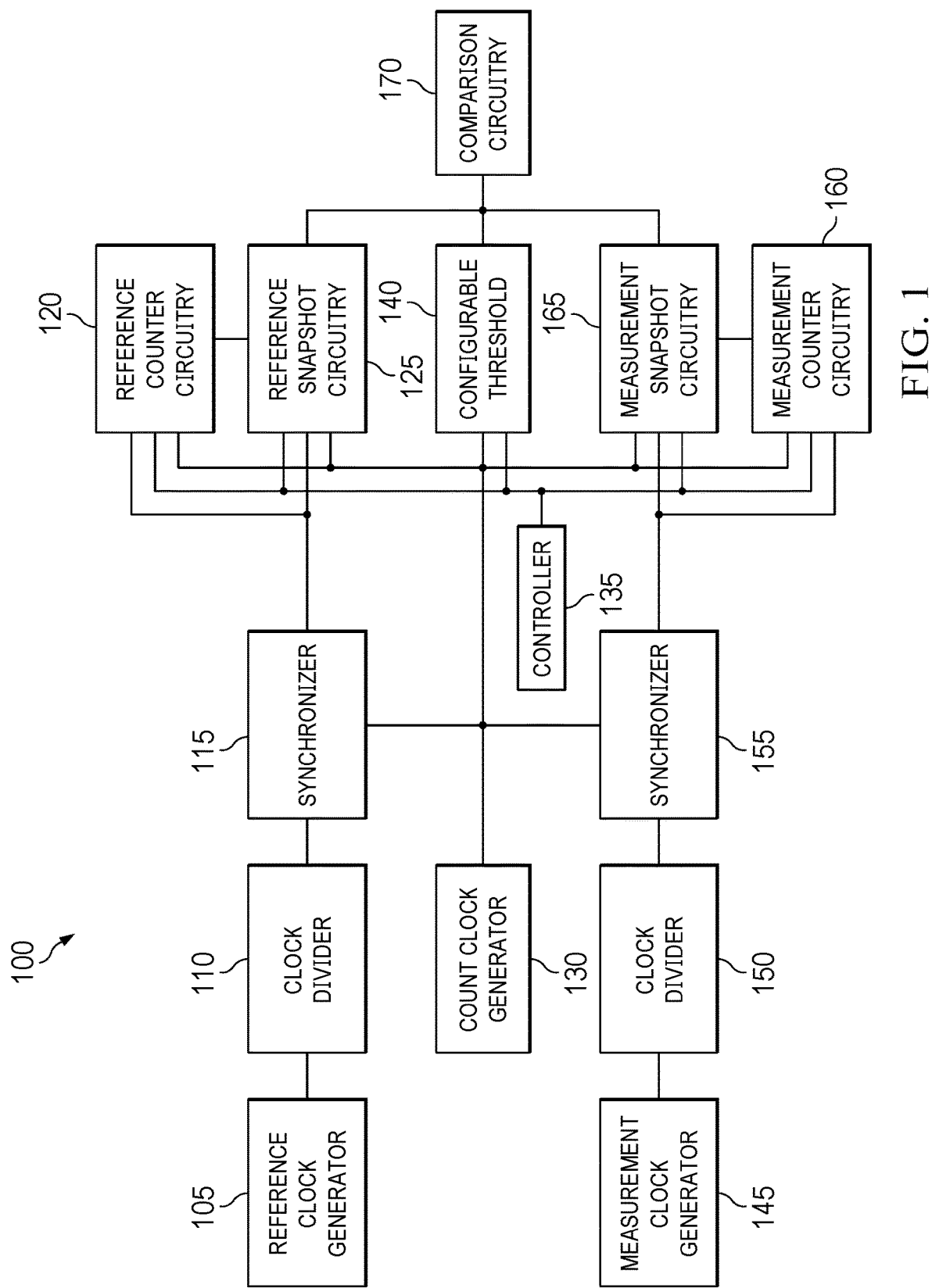
FIG. 1 is a block diagram of example frequency excursion circuitry configured to detect frequency excursion greater than or equal to a threshold.

The drawings are not necessarily to scale. Generally, the same reference numbers in the drawing(s) and this description refer to the same or like parts. Although the drawings show layers and regions with clean lines and boundaries, some or all of these lines and/or boundaries may be idealized. In reality, the boundaries and/or lines may be unobservable, blended and/or irregular.

Clock sources include circuitry which generates a clock signal having a clock frequency. In some systems, such as in a microcontroller unit (MCU) or in a microprocessor unit (MPU), an accurate clock signal is needed to ensure functionality and to implement safety features. For example, an inaccurate clock signal provided to processor circuitry may cause the processor circuity to fail to detect a system alert configured to prevent excessive power from being supplied to a system. Such system alerts are configured prevent permanent damage to the system by initiating a service routine. In such an example, failure to detect such an alert may be due to variations, called frequency excursions, of the clock signal from a desired frequency. Typically, frequency excursion of clock signals is designed to remain within a narrow range so that the clock signals have sufficient accuracy to ensure functionality of a system. Variations in the frequency of a clock signal beyond a designed range may be referred to as frequency excursion.

Frequency excursion from a desired frequency of a clock source occurs in response to variations in temperature of the circuitry, aging of the circuitry, manufacturing variations, variations in power being supplied to the circuitry, excessive noise, etc. Applications are designed to accommodate frequency excursion within a designed threshold of frequencies to ensure a wide range of operating conditions. Some systems include frequency excursion circuitry to detect frequency excursion from a desired frequency of a clock signal greater than the designed threshold. For example, an MCU may include frequency excursion circuitry to detect when a clock frequency varies beyond a designed range of frequencies, such as between plus or minus five percent of the desired frequency. In such an example, the MCU switches to a reference clock in response to the frequency excursion circuitry detecting a variation in the frequency of a measured clock greater than the threshold value.

Frequency excursion detection circuitry may be included in systems, such as clock multipliers, in which a frequency of a clock signal is critical to proper operation and excursions from a desired frequency may result in errors provided to additional circuitry. Conventional frequency excursion detection circuitry includes a measurement clock input, a reference clock input, two independent counters, and comparison circuitry. The measurement clock input is configured to be coupled to a first clock which generates a measurement clock signal of a first frequency, and the reference clock input is configured to be coupled to a second clock which generates a reference clock signal of a second frequency. The measurement clock signal is the clock signal being checked for frequency excursion, while the reference clock signal is being compared to the measurement clock signal. The counters are configured to count a number of cycles of the measurement clock signal and the reference clock signal within a duration of time. The counts are then compared to determine frequency excursion. The number of cycles counted within the duration of time indicates a magnitude of excursion. For example, a twenty-five percent frequency excursion corresponds to a first counter counting five cycles of the measurement clock signal, while a second counter counts four cycles of the reference clock signal. In such an example, the comparison circuitry determines frequency excursion based on a comparison of the first counter to the second counter. The comparison circuitry may be configured to determine frequency excursion greater than a certain accuracy. For example, the comparison circuitry determines frequency excursion when a difference between the first counter and the second counter is greater than five percent. The number of cycles needed to be counted by the counters increases as the accuracy of the frequency excursion detection increases. For example, for two percent frequency excursion detection the counters would need at least one of the counters to count fifty cycles of either of the clocks to determine a two percent frequency excursion. The comparison circuitry is configured to compare count values from each of the counters, while the count values represent the same duration of time. For example, the measured count and the reference count need to start counting at a rising edge and stop counting at a falling edge to represent approximately the same duration of time. The comparison of the counter values may only occur at a time corresponding to both counters being incremented, such as a rising edge of both the measurement clock signal and the reference clock signal.

The examples described herein include a method and apparatus to detect frequency excursion using frequency excursion circuitry capable of detecting frequency excursion in one cycle of a measured clock and one cycle of a reference clock. In some examples, the frequency excursion circuitry includes a reference clock generator, a measured clock generator, and a count clock generator. The reference clock generator and the measured clock generator are configured to generate clock signals of substantially the same frequency. The count clock generator is configured to generate a count clock signal of a frequency greater than the frequency of the reference and measurement clocks. The frequency excursion circuitry further includes a reference counter and a measurement counter. The reference counter counts a number of cycles of the count clock that transpire in one cycle of the reference clock. The measurement counter counts a number of cycles of the count clock that transpire in one cycle of the measurement clock. Comparison circuitry compares the difference in the counter values to a threshold value to determine frequency excursion. Advantageously, the frequency excursion circuitry described detects frequency excursion of the measured clock in approximately one cycle of the measured clock and one cycle of the reference clock.

FIG. 1 is a block diagram of example frequency excursion circuitry 100 configured to detect frequency excursion greater than or equal to a threshold. In the example of FIG. 1, the frequency excursion circuitry 100 includes a reference clock generator 105, a first clock divider 110, a first synchronizer 115, reference counter circuitry 120, reference snapshot circuitry 125, a count clock generator 130, a controller 135, a configurable threshold 140, a measurement clock generator 145, a second clock divider 150, a second synchronizer 155, measured counter circuitry 160, measured snapshot circuitry 165, and comparison circuitry 170. The frequency excursion circuitry 100 is configured to count, by the counter circuitry 120 and 160, a number of cycles of the count clock generator 130 in a single cycle of each clock generated by the clock generators 105 and 145. The frequency excursion circuitry 100 determines frequency excursion of the measurement clock generator 145 by comparing the counts for both of the clock generators 105 and 145 to a threshold value. Advantageously, the accuracy of the frequency excursion circuitry 100 may vary without extending the number of cycles of the reference clock generator 105 and/or the measurement clock generator 145 needed to determine frequency excursion.

In the example of FIG. 1, the reference clock generator 105 is coupled to the first clock divider 110. The reference clock generator 105 generates a reference clock signal of a frequency. The frequency is less than a frequency of the count clock generator 130. For example, an application including a ten megahertz (MHz) reference clock signal from the reference clock generator 105 further includes a ten megahertz (MHz) measurement clock signal from the measurement clock generator 145 and a four hundred megahertz (MHz) count clock signal from the count clock generator 130. The reference clock generator 105 is configured to supply the reference clock signal to the first clock divider 110.

The first clock divider 110 is coupled between the reference clock generator 105 and the first synchronizer 115. In one example, the first clock divider 110 is configured to generate a divided reference clock signal by dividing the frequency of the reference clock signal, from the reference clock generator 105, in half. For example, the frequency of the divided reference clock signal is five megahertz (MHz) if the frequency of the reference clock signal is ten megahertz (MHz). In such an example, a period of the divided reference clock signal is twice a period of the reference clock signal. Alternatively, the first clock divider 110 may be configured to divide the frequency of the reference clock generator 105 by any value, with slight modifications to the frequency excursion circuitry. Advantageously, the number of pulses of the count clock generator 130 while the divided clock signal is a logical high is equal to the number of pulses of the count clock generator 130 during a single period of the reference clock signal. The first clock divider 110 is configured to supply the divided reference clock signal to the first synchronizer 115.

The first synchronizer 115 is coupled to the first clock divider 110, the reference counter circuitry 120, the reference snapshot circuitry 125, and the count clock generator 130. The first synchronizer 115 generates a synchronized divided reference clock signal by synchronizing an edge (e.g., a rising edge) of the divided reference clock signal from the first clock divider 110 to an edge (e.g., a rising edge) of the count clock signal from the count clock generator 130. For example, the first synchronizer 115 may include a three-stage synchronizer and may delay the divided reference clock signal from the first clock divider 110 by up to four cycles of the count clock signal from the count clock generator 130. Advantageously, a count of the number of pulses of the count clock signal from the count clock generator 130 during half a period of the divided reference clock signal from the first clock divider 110 may begin at a rising edge of both the count clock signal and the divided reference clock signal. The first synchronizer 115 is configured to supply the synchronized divided reference clock signal to the reference counter circuitry 120 and the reference snapshot circuitry 125.

The reference counter circuitry 120 is coupled to the first synchronizer 115, the reference snapshot circuitry 125, the count clock generator 130, and the controller 135. The reference counter circuitry 120 generates a reference count value by counting the number of cycles of the count clock signal, from the count clock generator 130, in half a cycle of the synchronized divided reference clock signal from the first synchronizer 115. In the example of FIG. 1, half of a cycle of the synchronized divided reference clock signal is approximately (preferably exactly) equal to a cycle of the reference clock signal. For example, the reference counter circuitry 120 generates a reference count value of 10 in response to a frequency of the reference clock signal being ten megahertz (MHz) and a frequency of the count clock signal being one hundred megahertz (MHz). Alternatively, the reference counter circuitry 120 may be configured to generate the reference count value by counting the number of rising edges of the count clock signal from the count clock generator 130. The reference counter circuitry 120 is configured to set the reference counter value to zero based on the controller 135. Alternatively, the reference counter circuitry 120 may be configured to set the reference counter value to zero in response to supplying the reference counter value to the reference snapshot circuitry 125. Advantageously, variations in the reference count value correspond to frequency excursion of the reference clock generator 105. The reference counter circuitry 120 is configured to supply the reference count value to the reference snapshot circuitry 125.

The reference snapshot circuitry 125 is coupled to the first synchronizer 115, the reference counter circuitry 120, the count clock generator 130, the controller 135, and the comparison circuitry 170. The reference snapshot circuitry 125 sets a reference count value to be equal to the reference count value from the reference counter circuitry 120. The reference snapshot circuitry 125 holds the reference snapshot value during durations of the synchronized divided clock signal from the first synchronizer 115 which are equal to a logical low. For example, the reference snapshot value is equal to reference count value during a duration in time that the reference counter circuitry 120 is counting the number of cycles of the count clock signal from the count clock generator 130. In such an example, the reference snapshot circuitry 125 holds the reference snapshot value equal to the reference count value at the time of a falling edge of the synchronized divided reference clock signal from the first synchronizer 115. The reference snapshot circuitry 125 is configured to set the reference snapshot value equal to zero based on the controller 135. Advantageously, the reference snapshot circuitry 125 holds the reference snapshot value equal to the number of cycles of the count clock signal from the count clock generator 130 during durations that the synchronized divided reference clock signal from the first synchronizer 115 is not causing the reference counter circuitry 120 to count. The reference snapshot circuitry 125 supplies the reference snapshot value to the comparison circuitry 170.

The count clock generator 130 is coupled to the synchronizers 115 and 155, the counter circuitry 120 and 160, the snapshot circuitry 125 and 165, and the configurable threshold 140. The count clock generator 130 generates the count clock signal of a predetermined frequency. The predetermined frequency of the count clock signal is greater than the frequency of the clock generators 105 and 145 to enable a count value determined by the counter circuitry 120 and 160 to be greater than zero. The accuracy of the frequency excursion circuitry 100 may be improved by increasing the frequency of the count clock signal relative to the frequency of the reference clock generator 105 and/or the measurement clock generator 145. For example, the reference counter value determined by the reference counter circuitry 120 indicates frequency excursion when one or more cycles of the count clock signal from the count clock generator 130 cause the reference counter circuitry 120 to increase the reference count value. Advantageously, the frequency excursion circuitry 100 detects frequency excursion greater than or equal to one cycle of the count clock generator 130. The count clock generator 130 is configured to supply the count clock signal to the synchronizers 115 and 155, the counter circuitry 120 and 160, the snapshot circuitry 125 and 165, and the configurable threshold 140.

The controller 135 is coupled to the counter circuitry 120 and 160, the snapshot circuitry 125 and 165, and the configurable threshold 140. The controller 135 may be configured to clear the count values of the counter circuitry 120 and 160 in response to a falling edge of the synchronized divided clock signals. For example, the controller 135 sets the value of the reference counter circuitry 120 to zero in response to the reference count value remaining the same for one or more cycles of the count clock generator 130. The controller 135 may be configured to clear the snapshot values of the snapshot circuitry 125 and 165 in response to a rising edge of the synchronized divided clock signals. The controller 135 is configured to set a threshold value of the configurable threshold 140.

The configurable threshold 140 is coupled to the count clock generator 130, the controller 135, and the comparison circuitry 170. The configurable threshold 140 includes a threshold value. The threshold value may be set and/or cleared by the controller 135. The threshold value is a number of cycles of the count clock generator 130 corresponding to the frequency excursion circuitry 100 determining a frequency excursion from the frequency of the measurement clock generator 145. The frequency excursion circuitry 100 determines frequency excursion of the measurement clock generator 145 in response to a determination that a difference between the reference snapshot value and a measurement snapshot value is greater than the threshold value. For example, the threshold value is twenty-five, representative of twenty-five cycles of the count clock generator 130, for an accuracy between two and a half percent and six and two-thirds percent for a frequency of the measured clock generator 145 equal to ten megahertz (MHz), a frequency of the reference clock generator 105 equal to twenty-five megahertz (MHz), and a frequency of the count clock generator 130 equal to four-hundred megahertz (MHz). In such an example, the frequency excursion circuitry 100 determines frequency excursion in response to a difference between the count values of the counter circuitry 120 and 160 being greater than or equal to twenty-five. In such an example, the number of cycles of the count clock generator 130 in a cycle of the reference clock generator 105 is equal to forty and the number of cycles of the count clock generator 130 in a cycle of the measurement clock generator 145 being sixteen during an example operation without frequency excursion. Advantageously, the threshold value may be reduced to reduce the number of count clock cycles corresponding to frequency excursion.

The measurement clock generator 145 is coupled to the second clock divider 150. The measurement clock generator 145 generates a measurement clock signal of a predetermined frequency. The measurement clock generator 145 is representative of a clock generator which is being monitored for frequency excursion. Advantageously, the comparison circuitry 170 may compare counts generated by the counter circuitry 120 and 160 to determine frequency excursion for predetermined frequencies less than the frequency of the count clock 130. The measurement clock generator 145 is configured to supply the measurement clock signal to the second clock divider 150.

The second clock divider 150 is coupled between the measurement clock generator 145 and the second synchronizer 155. Similar to the first clock divider 110, the second clock divider 150 is configured to generate a divided measurement clock signal by dividing the frequency of the measurement clock signal, from the measurement clock generator 145, in half. For example, the frequency of the divided measurement clock signal is five megahertz (MHz) when the frequency of the measurement clock signal is ten megahertz (MHz). In such an example, a period of the divided measurement clock signal is twice a period of the measurement clock signal. Advantageously, the number of pulses of the count clock generator 130, while the divided clock signal is a logical high, is equal to the number of pulses of the count clock generator 130 during a single period of the measurement clock signal. The second clock divider 150 is configured to supply the divided measurement clock signal to the second synchronizer 155.

The second synchronizer 155 is coupled to the count clock generator 130, the second clock divider 150, the measured counter circuitry 160, and the measured snapshot circuitry 165. The second synchronizer 155 generates a synchronized divided measurement clock signal by synchronizing a rising edge of the divided measurement clock signal from the second clock divider 150 to a rising edge of the count clock signal from the count clock generator 130. For example, the second synchronizer 155 may delay the divided measurement clock signal from the second clock divider 150 by up to a period of the count clock signal from the count clock generator 130. Advantageously, a count of the number of pulses of the count clock signal from the count clock generator 130 during half a period of the divided measurement clock signal from the second clock divider 150 may begin at a rising edge of both the count clock signal and the divided measurement clock signal. The second synchronizer 155 is configured to supply the synchronized divided measurement clock signal to the measured counter circuitry 160 and the measured snapshot circuitry 165.

The measured counter circuitry 160 is coupled to the count clock generator 130, the controller 135, the second synchronizer 155, and the measured snapshot circuitry 165. The measured counter circuitry 160 generates a measured count value by counting the number of cycles of the count clock signal from the count clock generator 130 in half a cycle of the synchronized divided measurement clock signal from the second synchronizer 155. For example, the measured counter circuitry 160 generates a measured count value of 10 in response to a frequency of the measurement clock signal being one megahertz (MHz) and a frequency of the count clock signal being ten megahertz (MHz). Alternatively, the measured counter circuitry 160 may be configured to generate the measured count value by counting the number of rising edges of the count clock signal from the count clock generator 130. The measured counter circuitry 160 is configured to set the measured counter value to zero based on the controller 135. Alternatively, the measured counter circuitry 160 may be configured to set the reference counter value to zero in response to supplying the measured counter value to the measured snapshot circuitry 165. Advantageously, variations in the measured count value correspond to frequency excursion of the measurement clock generator 145. The measured counter circuitry 160 is configured to supply the measured count value to the measured snapshot circuitry 165.

The measured snapshot circuitry 165 is coupled to the count clock generator 130, the controller 135, the second synchronizer 155, the measured counter circuitry 160, and the comparison circuitry 170. The measured snapshot circuitry 165 sets a measured count value to be equal to the measured count value from the measured counter circuitry 160. The measured snapshot circuitry 165 holds the measurement snapshot value during durations of the synchronized divided measurement clock signal from the second synchronizer 155 which are equal to a logical low. For example, the measurement snapshot value is equal to measured count value during a duration in time that the measured counter circuitry 160 is counting the number of cycles of the count clock signal from the count clock generator 130. In such an example, the measured snapshot circuitry 165 holds the measurement snapshot value equal to the measured count value at the time of a falling edge of the synchronized divided measurement clock signal from the second synchronizer 155. The measured snapshot circuitry 165 is configured to set the measurement snapshot value equal to zero based on the controller 135. Advantageously, the measured snapshot circuitry 165 holds the measurement snapshot value equal to the number of cycles of the count clock signal from the count clock generator 130 during durations that the synchronized divided measurement clock signal from the second synchronizer 155 is not causing the measured counter circuitry 160 to count. The measured snapshot circuitry 165 supplies the measurement snapshot value to the comparison circuitry 170.

The comparison circuitry 170 is coupled to the reference snapshot circuitry 125, the configurable threshold 140, and the measured snapshot circuitry 165. The comparison circuitry 170 determines frequency excursion based on a comparison of the reference snapshot value, from the reference snapshot circuitry, and the measurement snapshot value, from the measured snapshot circuitry 165, to the threshold value of the configurable threshold 140. For example, the comparison circuitry 170 subtracts the measurement snapshot value from the reference snapshot value to determine a difference in counter values for one period of the clock generators 105 and 145. In such an example, the comparison circuitry 170 determines frequency excursion by comparing an absolute value of the difference in counter values to the threshold value. The comparison circuitry 170 may generate an alert and/or switch a system clock to the reference clock generator 105 in response to determining frequency excursion greater than or equal to the threshold value.

Figure 2:
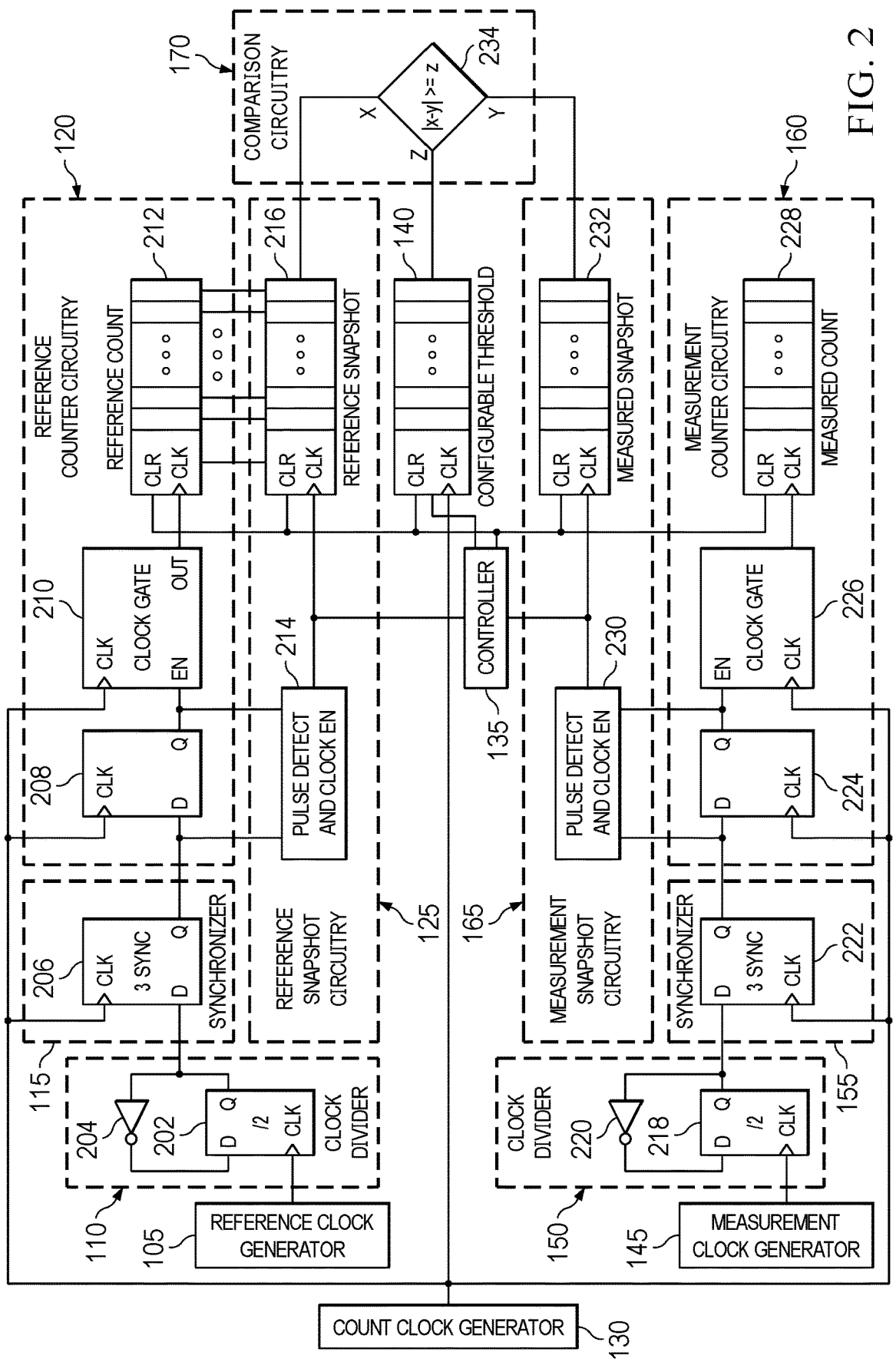
FIG. 2 is a schematic diagram of the frequency excursion circuitry of FIG. 1.

FIG. 2 is a schematic diagram of one example of the frequency excursion circuitry 100 of FIG. 1. In the example of FIG. 2, the first clock divider 110 includes a first flip-flop 202 and a first inverter 204. A clock input (CLK) of the first flip-flop 202 is coupled to the reference clock generator 105. The first inverter 204 is coupled between an output (Q) of the first flip-flop 202 and a data input (D) of the first flip-flop 202. The first inverter 204 is configured to set the input of the first flip-flop 202 equal to an inverted version of the output of the first flip-flop 202. The first flip-flop 202 and the first inverter 204 are configured to divide a frequency of the reference clock generator 105 in half. For example, the output of the first flip-flop 202 updates every logic high of the reference clock generator 105 as the input of the first flip-flop 202 inverts, by the first inverter 204, after the output updates. In such an example, the first flip-flop 202 latches the output of the first flip-flop 202 when the reference clock generator 105 is equal to a logic low. The output of the first flip-flop 202 is the divided reference clock signal including a frequency half that of the frequency of the reference clock generator 105. Alternatively, the first clock divider 110 may be modified to enable the first flip-flop 202 to be a JK flip-flop, set reset (SR) flip-flop, toggle (T) flip-flop, etc.

The first synchronizer 115 includes a second flip-flop 206. A clock input (CLK) of the second flip-flop 206 is coupled to the count clock generator 130. A data input (D) of the second flip-flop 206 is coupled to the output of the first flip-flop 202. An output (Q) of the second flip-flop 206 is coupled to the reference counter circuitry 120 and the reference snapshot circuitry 125. The second flip-flop 206 synchronizes rising edges of the divided reference clock on the output of the first flip-flop 202 to rising edges of the count clock generator 130. For example, the output of the second flip-flop 206 is latched until a rising edge of the count clock generator 130. The output of the second flip-flop 206 is the synchronized divided reference signal including a rising edge synchronized to a rising edge of the count clock generator 130. Alternatively, the second flip-flop 206 may be replaced with a three-stage synchronizer including a plurality of flip-flops or similar circuitry. Alternatively, the first synchronizer 115 may be modified to enable the second flip-flop 206 to be a JK flip-flop, set reset (SR) flip-flop, toggle (T) flip-flop, etc.

The reference counter circuitry 120 includes a third flip-flop 208, a first clock gate 210, and a first register 212. A clock input (CLK) of the third flip-flop 208 is coupled to the count clock generator 130. A data input (D) of the third flip-flop 208 is coupled to the output of the second flip-flop 206. An output (Q) of the third flip-flop 208 is coupled to the reference snapshot circuitry 125 and the first clock gate 210. The third flip-flop 208 is configured for pulse detection. The reference snapshot circuitry 125 may be coupled to the data input and the output of the third flip-flop 208 to determine whether an edge of the synchronized divided clock signal from the output of the second flip-flop 206 is a rising edge or a falling edge. Advantageously, the third flip-flop 208 enables the reference snapshot circuitry 125 to determine whether an edge of the synchronized divided clock signal is a rising edge or a falling edge. Alternatively, the reference counter circuitry 120 may be modified to enable the third flip-flop 208 to be a JK flip-flop, set reset (SR) flip-flop, toggle (T) flip-flop, etc.

A clock input (CLK) of the first clock gate 210 is coupled to the count clock generator 130. An enable input (EN) of the first clock gate 210 is coupled to the output of the third flip-flop 208. An output of the first clock gate 210 is coupled to the first register 212. The first clock gate 210 is configured to supply the count clock signal of the count clock generator 130 to clock inputs (CLK) of the first register 212 based on the enable input of the first clock gate 210. For example, the output of the first clock gate 210 is equal to the count clock generator 130 when the enable input of the first clock gate 210 is equal to a logic high. In such examples, the output of the first clock gate 210 is equal to the count clock generator 130 for approximately half of a cycle of the synchronized divided reference clock signal. Alternatively, the first clock gate 210 may be replaced with circuitry to supply the count clock generator 130 to the first register 212.

A clock input (CLK) of the first register 212 is coupled to the output of the first clock gate 210. A clear input (CLR) of the first register 212 is coupled to the controller 135. The clock input and the clear input of the first register 212 may be coupled to one or more flip-flops comprising the first register 212. The first register 212 is coupled to the reference snapshot circuitry 125. The first register 212 is configured to increment and/or store a reference count value representative of a number of clock pulses at the clock input of the first register 212. For example, the first register 212 may increment the reference count value by one every pulse received at the clock input, such as to count the number of pulses of the count clock generator 130 when the first clock gate 210 is enabled. Such a reference count value is a count of a number of pulses of the count clock generator 130 per half period of the synchronized divided reference clock signal or per period of the reference clock generator 105. The reference count value of the first register 212 may be cleared by the controller 135, such as to set the reference count value to zero. The reference count value may be set to zero in response to a determination of a falling edge of the synchronized divided reference clock signal and/or in response to the reference snapshot circuitry 125 storing the reference count value. Alternatively, the first register 212 may be replaced with circuitry to count a number of cycles of an input clock.

The reference snapshot circuitry 125 includes a first pulse detector 214 and a second register 216. The first pulse detector 214 is coupled to the data input and the output of the third flip-flop 208 and the second register 216. The first pulse detector 214 determines whether an edge of the synchronized divided reference clock signal of the output of the second flip-flop 206 is a rising edge or a falling edge. A rising edge is a transition from a logical low to a logical high, whereas a falling edge is a transition from a logical high to a logical low. For example, the first pulse detector 214 may determine a rising edge based on the data input of the third flip-flop 208 being a logic high and the output of the third flip-flop 208 being a logic low. In such an example, the first pulse detector 214 may determine a falling edge based on the data input of the third flip-flop 208 being a logic low and the output of the third flip-flop 208 being a logic high. The first pulse detector 214 generates a pulse and/or enables the second register 216 to store the reference count value of the first register 212. Alternatively, the first pulse detector 214 may be replaced with digital circuitry configured to enable an output in response to a determination of a falling and/or rising edge of a clock signal input.

The second register 216 is coupled to the controller 135, the comparison circuitry 170, the first register 212, and the first pulse detector 214. A clock input (CLK) of the second register 216 is coupled to the first pulse detector 214. A clear input (CLR) of the second register 216 is coupled to the controller 135. The clock input and the clear input of the second register 216 may be coupled to one or more flip-flops comprising the second register 216. The second register is configured to store a reference snapshot value representative of the reference count value of the first register 212. The reference snapshot value is the reference count value after half a period of the synchronized divided reference clock signal or a full period of the reference clock generator 105. For example, the reference snapshot value of the second register 216 is equal to the reference count value of the first register 212 after each falling edge detected by the first pulse detector 214. The controller 135 may set the reference snapshot value equal to the reference count value and/or clear the reference snapshot value. For example, the controller 135 may set the reference snapshot value to zero after the comparison circuitry 170 determines whether there is frequency excursion. The second register 216 is configured to provide the reference snapshot value to the comparison circuitry 170 to determine frequency excursion based on the reference snapshot value, a measurement snapshot value, and a threshold value. Alternatively, the second register 216 may be replaced with circuitry to store a count value from the first register 212.

The configurable threshold 140 is coupled to the count clock generator 130, the controller 135, and the comparison circuitry 170. The configurable threshold 140 may be a register (as illustrated) configured to store a threshold value. The controller 135 sets the threshold value. The controller 135 may be configured to determine the threshold value based on a designed accuracy and the frequency of the clock generators 105, 130, and/or 145. The designed accuracy being a tolerance of frequency variation which may occur without affecting the operations of a system (e.g., a MCU, MPU, etc.). Alternatively, the configurable threshold 140 may be replaced with circuitry to store a threshold value.

The second clock divider 150 includes a fourth flip-flop 218 and a second inverter 220. A clock input (CLK) of the fourth flip-flop 218 is coupled to the measurement clock generator 145. The second inverter 220 is coupled between an output (Q) of the fourth flip-flop 218 and a data input (D) of the fourth flip-flop 218. The second inverter 220 is configured to set the input of the fourth flip-flop 218 equal to an inverted version of the output of the fourth flip-flop 218. The fourth flip-flop 218 and the second inverter 220 are configured to divide a frequency of the measurement clock generator 145 in half. For example, the output of the fourth flip-flop 218 updates every logic high of the measurement clock generator 145 as the input of the fourth flip-flop 218 inverts, by the second inverter 220, after the output updates. In such an example, the fourth flip-flop 218 latches the output of the fourth flip-flop 218 when the measurement clock generator 145 is equal to a logic low. The output of the fourth flip-flop 218 is the divided measurement clock signal including a frequency half that of the frequency of the measurement clock generator 145. Alternatively, the second clock divider 150 may be modified to enable the fourth flip-flop 218 to be a JK flip-flop, set reset (SR) flip-flop, toggle (T) flip-flop, etc.

The second synchronizer 155 includes a fifth flip-flop 222. A clock input (CLK) of the fifth flip-flop 222 is coupled to the count clock generator 130. A data input (D) of the fifth flip-flop 222 is coupled to the output of the fourth flip-flop 218. An output (Q) of the fifth flip-flop 222 is coupled to the measured counter circuitry 160 and the measured snapshot circuitry 165. The fifth flip-flop 222 synchronizes rising edges of the divided measured clock on the output of the fourth flip-flop 218 to rising edges of the count clock generator 130. For example, the output of the fifth flip-flop 222 is latched on a rising edge of the count clock generator 130. The output of the fifth flip-flop 222 is the synchronized divided measured signal including a rising edge synchronized to a rising edge of the count clock generator 130. Alternatively, the fifth flip-flop 222 may be replaced with a three-stage synchronizer including a plurality of flip-flops or similar circuitry. Alternatively, the second synchronizer 155 may be modified to enable the fifth flip-flop 222 to be a JK flip-flop, set reset (SR) flip-flop, toggle (T) flip-flop, etc.

The measured counter circuitry 160 includes a sixth flip-flop 224, a second clock gate 226, and a third register 228. A clock input (CLK) of the sixth flip-flop 224 is coupled to the count clock generator 130. A data input (D) of the sixth flip-flop 224 is coupled to the output of the fifth flip-flop 222. An output (Q) of the sixth flip-flop 224 is coupled to the measured snapshot circuitry 165 and the second clock gate 226. The sixth flip-flop 224 is configured for pulse detection. The measured snapshot circuitry 165 may be coupled to the data input and the output of the sixth flip-flop 224 to determine whether an edge of the synchronized divided clock signal from the output of the fifth flip-flop 222 is a rising edge or a falling edge. Advantageously, the sixth flip-flop 224 enables the measured snapshot circuitry 165 to determine whether an edge of the synchronized divided clock signal is a rising edge or a falling edge. Alternatively, the measured counter circuitry 160 may be modified to enable the sixth flip-flop 224 to be a JK flip-flop, set reset (SR) flip-flop, toggle (T) flip-flop, etc.

A clock input (CLK) of the second clock gate 226 is coupled to the count clock generator 130. An enable input (EN) of the second clock gate 226 is coupled to the output of the sixth flip-flop 224. An output of the second clock gate 226 is coupled to the third register 228. The second clock gate 226 is configured to supply the count clock signal of the count clock generator 130 to the third register 228 based on the enable input of the second clock gate 226. For example, the output of the second clock gate 226 is equal to the count clock generator 130 when the enable input of the second clock gate 226 is equal to a logic high. In such examples, the output of the second clock gate 226 is equal to the count clock generator 130 for approximately half of a cycle of the synchronized divided measurement clock signal. Alternatively, the second clock gate 226 may be replaced with circuitry to supply the count clock generator 130 to the third register 228.

A clock input (CLK) of the third register 228 is coupled to the output of the second clock gate 226. A clear input (CLR) of the third register 228 is coupled to the controller 135. The clock input and the clear input of the third register 228 may be coupled to one or more flip-flops comprising the third register 228. The third register 228 is coupled to the measured snapshot circuitry 165. The third register 228 is configured to increment and/or store a measured count value representative of a number of clock pulses at the clock input of the third register 228. For example, the third register 228 may increment the measured count value by one every pulse received at the clock input, such as to count the number of pulses of the count clock generator 130 when the second clock gate 226 is enabled. Such a measured count value is a count of a number of pulses of the count clock generator 130 per half period of the synchronized divided measurement clock signal or per period of the measurement clock generator 145. The measured count value of the third register 228 may be cleared by the controller 135, such as to set the measured count value to zero. The measured count value may be set to zero in response to a determination of a falling edge of the synchronized divided measurement clock signal and/or in response to the measured snapshot circuitry 165 storing the measured count value. Alternatively, the third register 228 may be replaced with circuitry to count a number of cycles of an input clock.

The measured snapshot circuitry 165 includes a second pulse detector 230 and a fourth register 232. The second pulse detector 230 is coupled to the data input and the output of the sixth flip-flop 224 and the fourth register 232. The second pulse detector 230 determines whether an edge of the synchronized divided measurement clock signal of the output of the fifth flip-flop 222 is a rising edge or a falling edge. A rising edge is a transition from a logical low to a logical high, whereas a falling edge is a transition from a logical high to a logical low. For example, the second pulse detector 230 may determine a rising edge based on the data input of the sixth flip-flop 224 being a logic high and the output of the sixth flip-flop 224 being a logic low. In such an example, the second pulse detector 230 may determine a falling edge based on the data input of the sixth flip-flop 224 being a logic low and the output of the sixth flip-flop 224 being a logic high. The second pulse detector 230 generates a pulse and/or enables the fourth register 232 to store the measured count value of the third register 228. Alternatively, the second pulse detector 230 may be replaced with digital circuitry configured to enable an output in response to a determination of a falling and/or rising edge of a clock signal input.

The fourth register 232 is coupled to the controller 135, the comparison circuitry 170, the third register 228, and the second pulse detector 230. A clock input (CLK) of the fourth register 232 is coupled to the second pulse detector 230. A clear input (CLR) of the fourth register 232 is coupled to the controller 135. The clock input and the clear input of the fourth register 232 may be coupled to one or more flip-flops comprising the fourth register 232. The second register is configured to store a measurement snapshot value representative of the measured count value of the third register 228. The measurement snapshot value is the measured count value after half a period of the synchronized divided measurement clock signal or a full period of the measurement clock generator 145. For example, the measurement snapshot value of the fourth register 232 is equal to the measured count value of the third register 228 after each falling edge detected by the second pulse detector 230. The controller 135 may set the measurement snapshot value equal to the measured count value and/or clear the measurement snapshot value. For example, the controller 135 may set the measurement snapshot value to zero after the comparison circuitry 170 determines whether there is frequency excursion. The fourth register 232 is configured to provide the measurement snapshot value to the comparison circuitry 170 to determine frequency excursion based on the reference snapshot value, the measurement snapshot value, and the threshold value. Alternatively, the fourth register 232 may be replaced with circuitry to store a count value from the third register 228.

The comparison circuitry 170 includes an example comparator 234. The comparator 234 is coupled to the configurable threshold 140, the second register 216, and the fourth register 232. The comparator 234 determines frequency excursion by comparing the threshold value of the configurable threshold 140 to a difference between snapshot values of the snapshot circuitry 125 and 165. For example, when the frequencies of the clock generators 105 and 145 are equal, a difference between the snapshot values corresponds to frequency excursion of the measurement clock. In such an example, the comparison circuitry may only generate an alert of frequency excursion if the difference between snapshot values is greater than or equal to the threshold value. The difference between the reference snapshot value of the second register 216 and the measurement snapshot value of the fourth register 232 may be compared to the threshold value of the configurable threshold 140 based on the frequencies of the clock generators 105 and 145. The threshold value may be modified to reflect a difference in frequencies of the clock generators 105 and 145. For example, the controller 135 may scale and/or add to the threshold value to reflect the frequency of the reference clock generator 105 being greater than the frequency of the measurement clock generator 145. In such an example, the comparator 234 continues to determine frequency excursion by determining whether the threshold value is less than or equal to a subtraction of the reference snapshot value from the measurement snapshot value. The comparator 234 determines no frequency excursion based on a determination that an absolute value of a subtraction of the measurement snapshot value from the reference snapshot value is less than the threshold value. Alternatively, the comparator 234 may be configured to determine frequency excursion using a similar comparison of snapshots of the reference count value and the measured count value. Advantageously, the comparator 234 determines frequency excursion based on a difference in a count of cycles of the count clock generator 130 per cycle of the clock generators 105 and 145.

Figure 3:
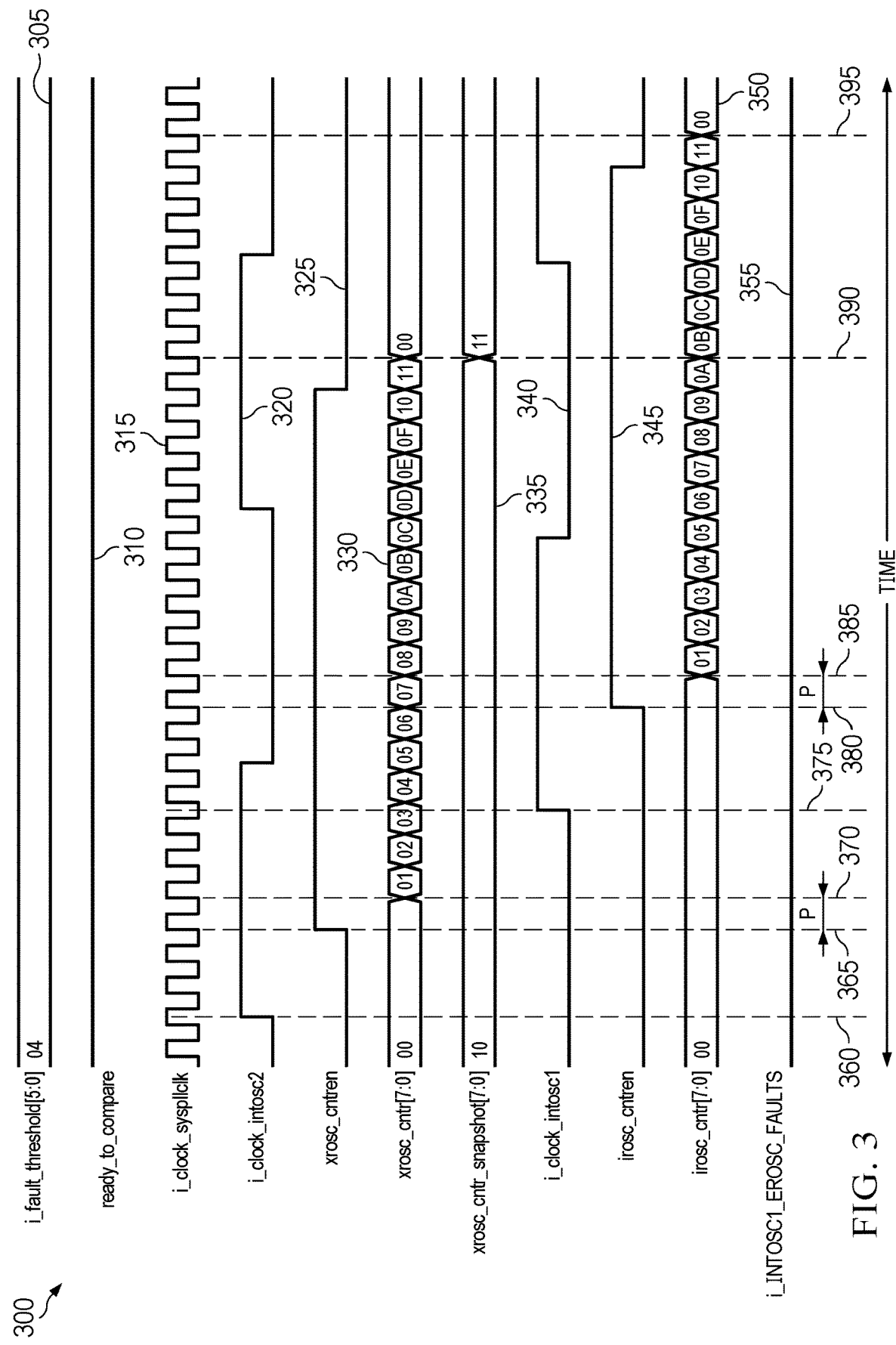
FIG. 3 is a timing diagram of an example operation of the frequency excursion circuitry of FIGS. 1 and 2.

FIG. 3 is an example timing diagram 300 of an example operation of the frequency excursion circuitry 100 of FIGS. 1 and 2 when there is no objectionable excursion. In the example of FIG. 3, the timing diagram 300 includes an example threshold value signal (i_fault_threshold[5:0]) 305, an example compare start signal (ready_to_compare) 310, an example count clock signal (i_clock_syspllclk) 315, an example measurement clock signal (i_clock_intosc2) 320, an example synchronized divided measurement clock signal (xcros cntren) 325, an example measurement count value signal (xcros_cntr[7:0]) 330, an example measurement snapshot signal (xcros_cntr_snapshot[7:0]) 335, an example reference clock signal (i_clock_intosc1) 340, an example synchronized divided reference clock signal (irosc_cntren) 345, an example reference count value signal (irosc_cntr[7:0]) 350, and an example fault detection signal (i_INTOSC1_EROSC_FAULTS) 355.

In the example of FIG. 3, the threshold value signal 305 represents a threshold value of the configurable threshold 140 of FIGS. 1 and 2. The compare start signal 310 represents a determination of the comparison circuitry 170 of FIGS. 1 and 2 indicating a reference snapshot value and/or a measurement snapshot value are ready to be compared. Additionally, the compare start signal 310 enables the frequency excursion circuitry 100 to determine frequency excursion greater than or equal to the threshold value.

The count clock signal 315 represents a clock signal generated by the count clock generator 130 of FIGS. 1 and 2. The count clock signal 315 is of a frequency greater than the frequency of the clock signals 320 and 340, such a frequency of the count clock signal 315 corresponds to a count clock period (P). The measurement clock signal 320 represents a clock signal generated by the measurement clock generator 145 of FIGS. 1 and 2. The synchronized divided measurement clock signal 325 represents a synchronized divided measured clock generated by the second synchronizer 155 of FIGS. 1 and 2. The measurement count value signal 330 represents a measured count value of the measured counter circuitry 160 of FIGS. 1 and 2. The measurement snapshot signal 335 represents a measurement snapshot value of the measured snapshot circuitry 165 of FIGS. 1 and 2.

The reference clock signal 340 represents a clock signal generated by the reference clock generator 105 of FIGS. 1 and 2. The synchronized divided reference clock signal 345 represents a synchronized divided reference clock generated by the first synchronizer 115 of FIGS. 1 and 2. The synchronized divided reference clock signal 345 is configured to enable the first clock gate 210 of FIG. 2. The reference count value signal 350 represents a reference count value of the reference counter circuitry 120 of FIGS. 1 and 2. The fault detection signal 355 represents a determination of the comparison circuitry 170 indicating frequency excursion greater than or equal to the threshold value.

At a first time 360, the measurement clock signal 320 transitions from a logic low to a logic high, indicating a rising edge of the measurement clock generator 145. At the first time 360, the rising edge of the measurement clock signal 320 is not synchronized with the count clock signal 315, such as the nearest rising edge of the count clock signal 315 is approximately a quarter of a cycle of the count clock signal (~¼P) 345 prior to the first time 360.

At a second time 365, the synchronized divided measurement clock signal 325 transitions from a logic low to a logic high, indicating a rising edge of the synchronized divided measurement clock signal 325. At the second time 365, the rising edge of the synchronized divided measurement clock signal 325 is synchronized with a rising edge of the count clock signal 315, such that the synchronized divided measurement clock signal 325 is a synchronized clock. The second synchronizer 155 synchronizes of the rising edges of the signals 325 and 345. The second synchronizer 155 may delay the rising edge of the measurement clock signal 320 from the rising edge of synchronized divided measurement clock signal 325. The delay between the rising edges of the signals 305 and 325 is a result of three-stage synchronization circuitry included in the second synchronizer 155. For example, the second synchronizer 155 delays the rising edge of the synchronized divided measurement clock signal 325 by less than three cycles when the rising edge of the measurement clock signal 320 occurs while the count clock signal 315 is a logical high. In such examples, the second synchronizer 155 delays the rising edge of the synchronized divided measurement clock signal 325 by more than three cycles when the rising edge of the measurement clock signal 320 occurs while the count clock signal 315 is a logical low. Advantageously, the synchronized divided measurement clock signal 325 enables the measured counter circuitry 160 to begin counting cycles of the count clock generator 130 on a rising edge.

At a third time 370, the measurement count value signal 330 transitions from zero to one, indicating a cycle of the count clock signal 315 between the second time 365 and the third time 370. The measurement count value signal 330 increments by one for every cycle of the count clock signal 315 while the synchronized divided measurement clock signal 325 is a logic high. For example, the third register 228 counts a number of the cycles of the count clock generator 130 between the time the synchronized divided measurement clock signal 325 of the output of the sixth flip-flop 224 enables and disables the second clock gate 226. In such examples, the time between enabling and disabling the second clock gate 226 corresponds to approximately one cycle of the measurement clock generator 145, which results in the measured count value of the third register 228 being representative of the number of cycles of the count clock signal 315 in one cycle of the measurement clock signal 320.

At a fourth time 375, the reference clock signal 340 transitions from a logic low to a logic high, indicating a rising edge of the reference clock generator 105. At the fourth time 375, the rising edge of the reference clock signal 340 is not synchronized with the count clock signal 315, such as the nearest rising edge of the count clock signal 315 is approximately a quarter of a cycle of the count clock signal (¼P) 315 following the first time 360.

At a fifth time 380, the synchronized divided reference clock signal 345 transitions from a logic low to a logic high, indicating a rising edge of the synchronized divided reference clock signal 345. At the fifth time 380, the rising edge of the synchronized divided reference clock signal 345 is synchronized with a rising edge of the count clock signal 315. The first synchronizer 115 of FIGS. 1 and 2 synchronizes of the rising edges of the signals 315 and 325. The first synchronizer 115 may delay the rising edge of the reference clock signal 340 from the rising edge of synchronized divided measurement clock signal 325. The delay between the rising edges of the signals 305 and 325 is a result of three-stage synchronization circuitry included in the first synchronizer 115. For example, the first synchronizer 115 delays the rising edge of the synchronized divided reference clock signal 345 by more than three cycles when the rising edge of the reference clock signal 340 occurs while the count clock signal 315 is a logical low. Advantageously, the synchronized divided reference clock signal 345 enables the reference counter circuitry 120 to begin counting cycles of the count clock generator 130 on a rising edge.

At a sixth time 385, the reference count value signal 350 transitions from zero to one, indicating a cycle of the count clock signal 315 between the fifth time 380 and the sixth time 385. The reference count value signal 350 increments by one for every cycle of the count clock signal 315 while the synchronized divided reference clock signal 345 is a logic high. For example, the first register 212 counts a number of the cycles of the count clock generator 130 between the time the synchronized divided reference clock signal 345 of the output of the third flip-flop 208 enables and disables the first clock gate 210. In such examples, the time between enabling and disabling the first clock gate 210 corresponds to approximately one cycle of the reference clock generator 105, which results in the reference count value of the first register 212 being representative of the number of cycles of the count clock signal 315 in one cycle of the reference clock signal 340.

At a seventh time 390, the measurement count value signal 330 decreases from seventeen (0x11 hexadecimal) to zero and the measurement snapshot signal 335 is set to seventeen (0x11 hexadecimal). At the seventh time 390, the measurement snapshot signal 335 is set to a value representative of the number of cycles of the count clock signal 315 in half a cycle of the synchronized divided measurement clock signal 325. At the seventh time 390, the controller 135 clears the value of the measurement count value signal 330 by setting the measured count value of the third register 228 to zero.

At an eighth time 395, the reference count value signal 350 decreases from seventeen (0x11 hexadecimal) to zero. At the eighth time 395, the reference count value signal 350 is a value representative of the number of cycles of the count clock signal 315 in half a cycle of the synchronized divided reference clock signal 345. At the eighth time 395, the controller 135 clears the value of the reference count value signal 350 by setting the reference count value of the first register 212 to zero. At the eighth time 395, the comparison circuitry 170 determine frequency excursion by comparing the threshold value signal 305 to a subtraction of the measurement snapshot signal 335 and the reference count value signal 350 or the reference snapshot value of the first register 212. At the eighth time 395, the comparison circuitry 170 determines no frequency excursion based on the difference between signals 310 and 335 not being greater than or equal to the threshold value signal 305.

Figure 4:
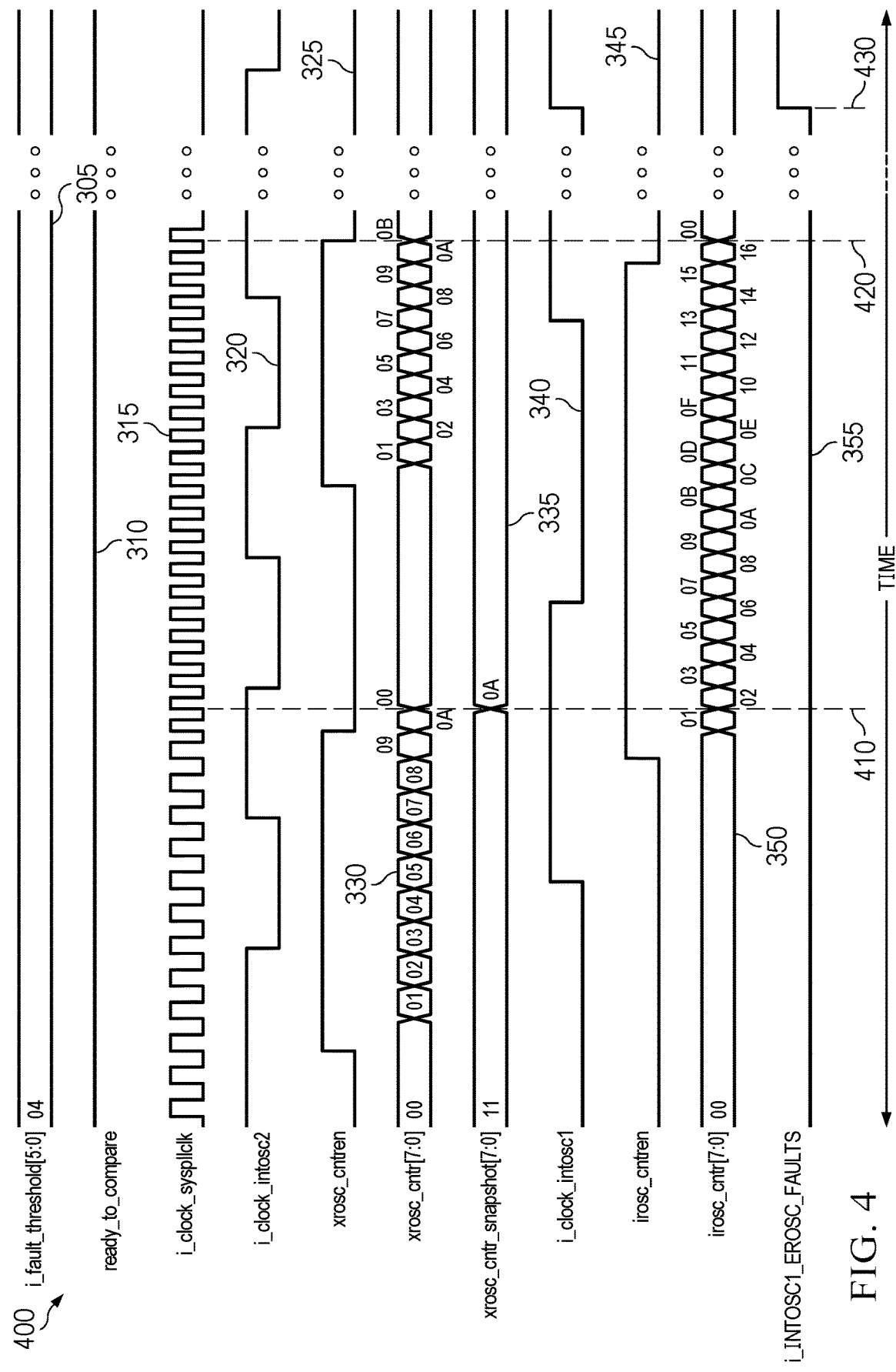
FIG. 4 is a timing diagram of an example operation of the frequency excursion circuitry of FIGS. 1 and 2 including detection of frequency excursion.

FIG. 4 is an example timing diagram 400 of an example operation of the frequency excursion circuitry 100 of FIGS. 1 and 2 including an example detection of frequency excursion. In the example of FIG. 4, the timing diagram 400 includes the measurement clock signal 320 of FIG. 3, the measurement snapshot signal 335 of FIG. 3, the threshold value signal 305 of FIG. 3, the measurement count value signal 330 of FIG. 3, the synchronized divided measurement clock signal 325 of FIG. 3, the reference clock signal 340 of FIG. 3, the reference count value signal 350 of FIG. 3, the synchronized divided reference clock signal 345 of FIG. 3, the count clock signal 315 of FIG. 3, the compare start signal 310 of FIG. 3, and the fault detection signal 355 of FIG. 3.

At a first time 410, the measurement count value signal 330 transitions from ten (0x0A in hexadecimal) to zero. At the first time 410, the measurement snapshot signal 335 is set equal to the measurement count value signal 330 prior to the measurement count value signal 330 being set to zero. At the first time 410, the measurement snapshot signal 335 is set to ten (0x0A in hexadecimal), indicating that there were ten cycles of the count clock signal 315 during one cycle of the measurement clock signal 320.

At a second time 420, the reference count value signal 350 transitions from twenty-two (0x16 in hexadecimal) to zero, indicating twenty-two cycles of the count clock signal 315 occurred during one cycle of the reference clock signal 340. At the second time 420, the comparison circuitry 170 of FIGS. 1 and 2 may determine whether frequency excursion has occurred. For example, the comparison circuitry 170 determines frequency excursion is present by determining the threshold value signal 305 is less than an absolute value of a subtraction of the measurement snapshot signal 335 from the reference count value signal 350, at the second time 420. In such an example, at the second time 420 the threshold value of the configurable threshold 140 of FIGS. 1 and 2 is equal to four, the reference snapshot value of the reference snapshot circuitry 125 of FIGS. 1 and 2 is twenty-two, and the measurement snapshot value of the measured snapshot circuitry 165 of FIGS. 1 and 2 is equal to ten, such as the comparison circuitry 170 determines the difference to be twelve and the threshold to be four.

At a third time 430, the fault detection signal 355 transitions from a logical low to a logical high, indicating a determination of frequency excursion. A duration between the second time 420 and the third time 430 is based on the comparison circuitry 170, such as gate delay in the comparator 234 of FIG. 2.

Figure 5:
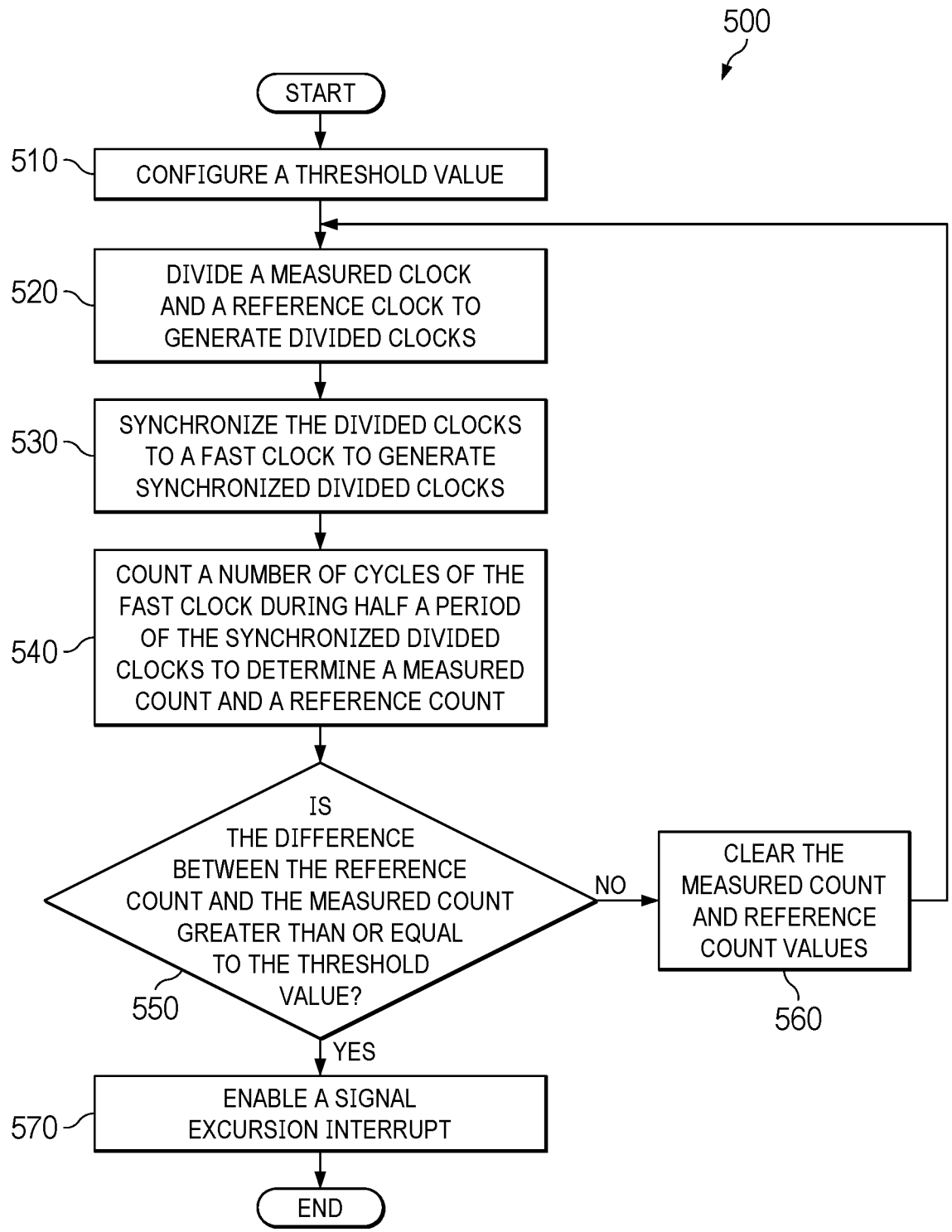
FIG. 5 is a flowchart representative of an example method to implement the frequency excursion circuitry of FIGS. 1 and 2 to configure a threshold, monitor a clock signal, and detect frequency excursion.

FIG. 5 is a flowchart representative of an example method 500 to implement the frequency excursion circuitry 100 of FIGS. 1 and 2 to configure for detection and detect frequency excursion. The method 500 begins at block 510. At block 510, the controller 135 of FIGS. 1 and 2 configures a threshold value of the configurable threshold 140 of FIGS. 1 and 2. For example, the controller 135 sets the threshold value signal 305 of FIGS. 3 and 4 to a threshold value. The controller 135 may determine the threshold value based on the count clock generator 130 of FIGS. 1 and 2 and/or the measurement clock generator 145 of FIGS. 1 and 2. For example, the controller 135 sets the threshold value of the configurable threshold 140 to approximately five percent of the frequency of the measurement clock generator 145. In such an example, the controller 135 rounds the determined percentage of the measurement clock generator 145 to a nearest number of cycles of the count clock generator 130. The method 500 proceeds to block 520.

At block 520, the clock dividers 110 and 150 of FIGS. 1 and 2 divide the clock generators 105 and 145 of FIGS. 1 and 2 to generate a divided reference clock and a divided measured clock. For example, first clock divider 110 divides the reference clock generator 105 to generate the divided reference clock. In such an example, the frequency of the divided reference clock is half of the frequency of the reference clock generator 105. The method 500 proceeds to block 530.

At block 530, the synchronizers 115 and 155 of FIGS. 1 and 2 synchronize a rising edge of the divided reference clock and/or the divided measured clock to a rising edge of the count clock generator 130 of FIGS. 1 and 2 to generate the synchronized divided clock signals 325 and 345 of FIGS. 3 and 4. For example, the second synchronizer 155 synchronizes the rising edge of the measurement clock signal 320 of FIGS. 3 and 4 at the first time 360 of FIG. 3 to a rising edge of the count clock signal 315 of FIGS. 3 and 4, at the second time 365 of FIG. 3. The synchronizers 115 and 155 generate the synchronized divided clock signals 325 and 345 by synchronizing a rising edge of the divided clock signals of block 520 to a rising edge of the count clock generator 130. The method proceeds to block 540.

At block 540, the counter circuitry 120 and 160 of FIGS. 1 and 2 count a number of cycles of the count clock during half a period of the synchronized divided clock signals to determine a measured count and a reference count. For example, the synchronized divided reference clock enables the first clock gate 210 of FIG. 2 to enable the first register 212 to count the number of cycles of the count clock generator 130. In such an example, the synchronized divided reference clock disables the first clock gate 210 to prevent the output of the first clock gate 210 from being set equal to the count clock generator 130. The method 500 proceeds to block 550.

At block 550, the comparison circuitry 170 of FIGS. 1 and 2 determine frequency excursion by determining if a difference between the reference count and the measured count of block 540 is greater than or equal to the threshold value of block 510. For example, the first pulse detector 214 of FIG. 2 sets the reference snapshot value of the reference snapshot circuitry 125 of FIGS. 1 and 2 to the reference count value of the reference counter circuitry 120 in response to determining a falling edge of the synchronized divided reference clock. In such an example, the comparison circuitry 170 compares the threshold value of the configurable threshold 140 to an absolute value of a subtraction of the measurement snapshot value of the measured snapshot circuitry 165 of FIGS. 1 and 2 from the reference snapshot value to determine frequency excursion. The method 500 proceeds to block 560 by determining that the difference between the reference count and the measured count is not greater than or equal to the threshold value, indicating no frequency excursion detected. The method 500 proceeds to block 570 by determining that the difference between the reference count and the measured count is greater than or equal to the threshold value, indicating frequency excursion is detected.

At block 560, the controller 135 clears the measured count and the reference count values of the counter circuitry 120 and 160. For example, at the times 390 and 395 of FIG. 3 the count value signals 330 and/or 350 are cleared to reset the count values to zero. The controller 135 clears the count value signals 330 and 350 to prepare for the following rising edge of the synchronized divided clock signals 325 and/or 345, such as to begin counting the cycles of the count clock generator 130 from zero. The method 500 proceeds to block 520 with the cleared reference count and measured count values.

At block 570, the comparison circuitry 170 sets the fault detection signal 355 of FIGS. 3 and 4 to enable a signal excursion interrupt. For example, the comparison circuitry 170 at the third time 430 of FIG. 4 sets the fault detection signal 355 to a logic high in response to determining frequency excursion greater than the threshold value of block 510. The method 500 proceeds to end.

FIG. 5 is a flowchart representative of an example method that may be performed using machine readable instructions that can be executed and/or hardware configured to implement the frequency excursion circuitry 100 of FIGS. 1 and 2 to determine frequency excursion of the measurement clock generator 145 of FIGS. 1 and 2.

Figure 6:
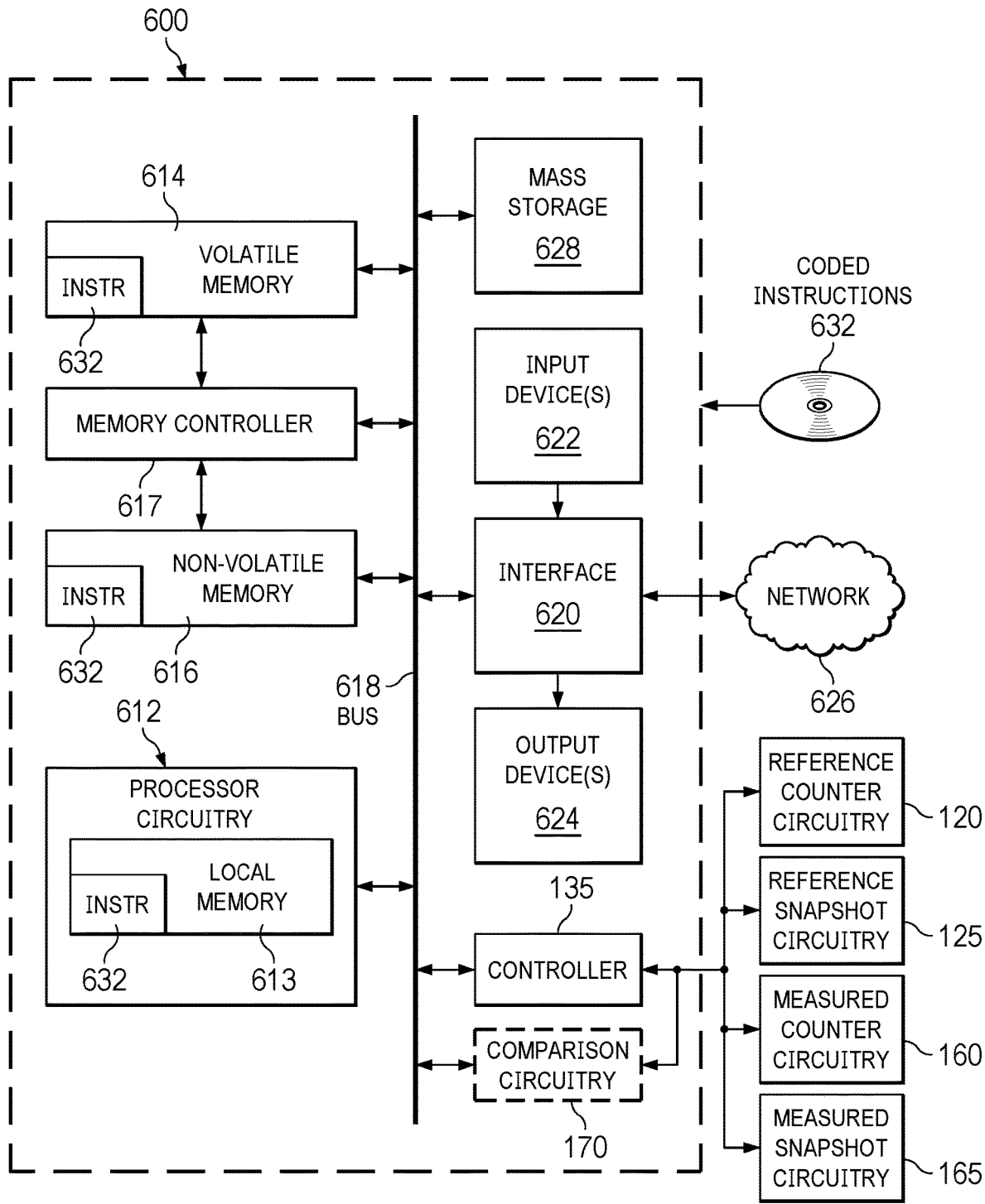
FIG. 6 is a block diagram of an example processing platform including processor circuitry structured to execute the example machine readable instructions and/or the example operations of FIG. 5 to implement the frequency excursion circuitry of FIGS. 1 and 2.

FIG. 6 is a block diagram of an example processing platform including processor circuitry structured to execute the example machine readable instructions and/or the example operations of FIG. 5 to implement the frequency excursion circuitry 100 of FIGS. 1 and 2. The processor platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing device.

The processor platform 600 of the illustrated example includes processor circuitry 612. The processor circuitry 612 of the illustrated example is hardware. For example, the processor circuitry 612 can be implemented by one or more integrated circuits, logic circuits, FPGAs, microprocessors, CPUs, GPUs, DSPs, and/or microcontrollers from any desired family or manufacturer. The processor circuitry 612 may be implemented by one or more semiconductor based (e.g., silicon based) devices. In this example, the processor platform 600 implements the controller 135 of FIGS. 1 and 2 and may implement the comparison circuitry 170 of FIGS. 1 and 2. Additionally, the circuitry 120, 125, 160, and 165 may be implemented by the processor platform 600.

The processor circuitry 612 of the illustrated example includes a local memory 613 (e.g., a cache, registers, etc.). The processor circuitry 612 of the illustrated example is in communication with a main memory including a volatile memory 614 and a non-volatile memory 616 by a bus 618. The volatile memory 614 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 616 may be implemented by flash memory and/or any other desired type of memory device. Access to the main memory 614, 616 of the illustrated example is controlled by a memory controller 617.

The processor platform 600 of the illustrated example also includes interface circuitry 620. The interface circuitry 620 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 622 are connected to the interface circuitry 620. The input device(s) 622 permit(s) a user to enter data and/or commands into the processor circuitry 612. The input device(s) 622 can be implemented by, for example, an audio sensor, a microphone, a camera (still or video), a keyboard, a button, a mouse, a touchscreen, a track-pad, a trackball, an isopoint device, and/or a voice recognition system.

One or more output devices 624 are also connected to the interface circuitry 620 of the illustrated example. The output device(s) 624 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 620 of the illustrated example, thus, typically includes a graphics driver card, a graphics driver chip, and/or graphics processor circuitry such as a GPU.

The interface circuitry 620 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 626. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 600 of the illustrated example also includes one or more mass storage devices 628 to store software and/or data. Examples of such mass storage devices 628 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives. The machine readable instructions 632, which may be implemented by the machine readable instructions of FIG. 5, may be stored in the mass storage device 628, in the volatile memory 614, in the non-volatile memory 616, and/or on a removable non-transitory computer readable storage medium such as a CD or DVD.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device.

For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications are possible in the described embodiments, and other embodiments are possible, within the scope of the claims.

What is claimed is:

1. A device comprising:
    first clock divider circuitry coupled to a first clock;
    first counter circuitry coupled to the first clock divider circuitry, the first counter circuitry configured to increment based on the first clock and a second clock;
    second clock divider circuitry coupled to a third clock;
    second counter circuitry coupled to the second clock divider circuitry, the second counter circuitry configured to increment based on the third clock and the second clock; and
    comparison circuitry coupled to the first and second counter circuitry.

2. The device of claim 1, wherein:
    the first clock divider circuitry includes:
        an inverter; and
        a flip-flop including a clock input, a data input, and an output;
    the clock input is coupled to the first clock; and
    the data input is coupled to the output by the inverter.

3. The device of claim 1, wherein:
    the device further comprises a first synchronizer coupled between the first clock divider circuitry and the first counter circuitry;
    the first counter circuitry includes a flip-flop, a clock gate, and a counter;
    the flip-flop is coupled to the first synchronizer and configured to detect a pulse on an output of the first synchronizer; and
    the clock gate includes:
        a clock input coupled to the second clock;
        an input coupled to the flip-flop; and
        an output coupled to the counter.

4. The device of claim 1, wherein:
    the device further comprises:
        first snapshot circuitry coupled to the first counter circuitry and to the comparison circuitry; and
        second snapshot circuitry coupled to the second counter circuitry and to the comparison circuitry; and
    the comparison circuitry includes circuitry to determine frequency excursion based on a difference between outputs of the first and second snapshot circuitry in comparison to a threshold value.

5. The device of claim 1 further comprising a first synchronizer and a second synchronizer, the first synchronizer coupled between the first clock divider circuitry and the first counter circuitry, and the second synchronizer coupled between the second clock divider circuitry and the second counter circuitry.

6. The device of claim 1 further comprising first snapshot circuitry and second snapshot circuitry, the first snapshot circuitry coupled between the first counter circuitry and the comparison circuitry, and the second snapshot circuitry coupled between the second counter circuitry and the comparison circuitry.

7. The device of claim 6 further comprising a controller coupled to the first and second counter circuitry and the first and second snapshot circuitry, the controller configured to:
    set a count value of the first and second counter circuitry to zero; and
    clear a snapshot value of the first and second snapshot circuitry.

8. A device comprising:
    first clock divider circuitry configured to divide a frequency of a first clock to generate a first divided clock;
    first counter circuitry coupled to the first clock divider circuitry and configured to generate a first count of pulses of a second clock during a duration of the first divided clock;
    second clock divider circuitry configured to divide a frequency of a third clock to generate a second divided clock;
    second counter circuitry coupled to the first clock divider circuitry and configured to generate a second count of pulses of the second clock during a duration of the second divided clock; and
    comparison circuitry configured to compare the first count to the second count.

9. The device of claim 8 further comprising a register configured to store a threshold value that represents frequency excursion as a number of cycles of the second clock.

10. The device of claim 8, wherein the first clock divider circuitry and the second clock divider circuitry are configured to divide the frequency of the first clock and the third clock by two.

11. The device of claim 8, wherein the comparison circuitry is configured to determine frequency excursion based on a difference between the first count and the second count in comparison to a threshold value.

12. The device of claim 8 further comprising a first synchronizer coupled between the first clock divider circuitry and the first counter circuitry and configured to synchronize at least one of a rising edge or a falling edge of the first divided clock to a rising edge of the second clock to generate a first synchronized clock.

13. The device of claim 8 further comprising first snapshot circuitry coupled to the first counter circuitry and configured to hold a first snapshot value of the first count at a falling edge of the first divided clock, the first snapshot value to represent the first count compared by the comparison circuitry.

14. The device of claim 13 further comprising second snapshot circuitry coupled to the second counter circuitry and configured to hold a second snapshot value of the second count at a falling edge of the second divided clock, the second snapshot value to represent the second count compared by the comparison circuitry.

15. A method comprising:
dividing, by first clock divider circuitry, a frequency of a first clock to generate a first divided clock;
determining, by first counter circuitry, a first count of pulses of a second clock during a duration of the first divided clock;
dividing, by second clock divider circuitry, a frequency of a third clock to generate a second divided clock;
determining, by second counter circuitry, a second count of pulses of the second clock during a duration of the second divided clock; and
comparing, by comparison circuitry, the first count to the second count.

16. The method of claim 15 further comprising dividing the frequency of the first clock and the third clock by two to generate the first and second divided clock, respectively.

17. The method of claim 15 further comprising determining frequency excursion of the third clock by comparing a threshold value to a difference between the first count from the second count.

18. The method of claim 15 further comprising:
synchronizing, by a first synchronizer, at least one of a rising edge or falling edge of the first divided clock to a rising edge of the second clock to synchronize the first divided clock to the second clock; and
synchronizing, by a second synchronizer, at least one of a rising edge or a falling edge of the second divided clock to the rising edge of the second clock to synchronize the second divided clock to the second clock.

19. The method of claim 15 further comprising clearing the first count and the second count in response to setting a first snapshot value equal to the first count and a second snapshot value equal to the second count.

20. The method of claim 15 further comprising determining a threshold value to represent frequency excursion as a number of cycles of the second clock.

* * * * *